US005998067A

United States Patent
Gelbart

[19]

[11] Patent Number: 5,998,067
[45] Date of Patent: Dec. 7, 1999

[54] MASK FOR EXPOSING FLEXOGRAPHIC PLATES

[75] Inventor: Daniel Gelbart, Vancouver, Canada

[73] Assignee: Creo Products Inc., Burnaby, Canada

[21] Appl. No.: 09/003,140

[22] Filed: Jan. 6, 1998

Related U.S. Application Data

[63] Continuation-in-part of application No. 08/658,785, Jun. 5, 1996, abandoned.

[51] Int. Cl.$^6$ .......................................................... G03F 9/00
[52] U.S. Cl. ................................................. 430/5; 430/302
[58] Field of Search ................................ 430/5, 300, 302

[56] References Cited

U.S. PATENT DOCUMENTS

| | | | |
|---|---|---|---|
| 5,213,916 | 5/1993 | Cronin et al. | 430/5 |
| 5,262,275 | 11/1993 | Fan | 430/273 |
| 5,304,441 | 4/1994 | Samvelo et al. | 430/30 |
| 5,725,972 | 3/1998 | Takeshita | 430/5 |

OTHER PUBLICATIONS

Optical Proximity Effects—Mirolithography World., Spring. 1996. pp. 22–23., C. Mack.

*Primary Examiner*—Janet Baxter
*Assistant Examiner*—Rosemary Ashton
*Attorney, Agent, or Firm*—Oyen Wiggs Green & Mutala

[57] ABSTRACT

A mask for exposing flexographic plates contains, besides the standard binary image, areas shaded with a partially light absorbing layer. This partial light absorbance changes the exposure in certain areas and optimizes exposure separately for each different part of the image. The mask can be a separate film or integral to the plate. The required absorbance can be automatically computed when the mask is being generated. The invention is particularly useful with thermal films, as thermal films do not have to trade off edge sharpness and gray levels.

5 Claims, 2 Drawing Sheets

MASK FOR EXPOSING FLEXOGRAPHIC PLATES

RELATED APPLICATIONS

The present application is a continuation-in-part of application Ser. No. 08/658,785 filed Jun. 5, 1996.

FIELD OF THE INVENTION

The invention relates to printing and more specifically, to the making of photo-polymer type flexographic printing plates.

BACKGROUND OF THE INVENTION

In the making of flexographic printing plates using photo-polymers a mask, typically a halftone film, is placed over a photo-polymer. A traditional halftone film is a film having only two states: fully clear and fully light absorbing (opaque). This is the standard film used in the printing industry for exposing printing plates. In order to print shades of gray, or "gray scale", a technique called screening is used. Each shade of gray is represented by a different size or density of small dots. Thus the film and the plate it produces are binary, having no gray scale. The gray scale is produced by the screening process. The photo-polymer can be a solid or liquid. The photo-polymer is exposed through the film for a few minutes by high power U.V. (ultra violet) light. The clear areas in the mask allow the U.V. light to pass and harden (i.e. cross-link) the photo-polymer. For best results, different areas in the image require different exposures. For example, a single dot on the film surrounded by wide clear areas is sensitive to overexposure, since too much light will cause the dot to disappear due to light leakage into the polymer under the dot (black areas on film become non-printing areas on the plate as the polymer does not harden and is washed away or removed in processing). The opposite is true for a single clear dot in the middle of a large black area of film. The clear dot will not receive sufficient exposure. This problem is well known in the industry and the common solution is to use small pieces of opaque material as masks, to be moved around judiciously during the exposure process. This operation is time consuming and requires a skilled operator to place the small light blocking masks on top of the main mask and remove them at the appropriate point in the exposure. It is the object of the invention to use a variable absorbance mask in order go be able to expose the complete flexographic plate with a single exposure. It is a further object of the invention to produce a flexographic plate with higher resolution than currently possible. In the prior art partial absorbance in mask was used to blend the edges between different masks, as in U.S. Pat. No. 5,286,584, or to reproduce gray scales without screening, as is common in gray scale photographs. The novelty lies in the use of halftones (screening) and gray scales on the same mask.

SUMMARY OF THE INVENTION

The invention uses a film which combines a binary (halftone) image, such as lines and screens, with a variable light absorbance areas ("gray scales") in order to balance the exposure according to the image contents. It is particularly desired to use thermal, rather than silver halide, film. Unlike silver halide film, which has to trade off edge sharpness against gray scale capability, some thermal films can produce superior edge sharpness with gray scales on the same film. According to the invention the flexographic plate is exposed, via the film, to the highest exposure required anywhere in the plate. For areas requiring less exposure the film has a variable optical density (variable light absorbance) to achieve the optimal exposure for each feature. A further improvement is achieved by making this film an integral part of the plate, to be peeled off or dissolved prior to the processing of the plate. The use of screened, or halftone films is well known. The use of "gray scale" films, having variable absorbance, is also well known. The novelty is combining halftones (screening) with variable absorbance on the same film. The film, or mask, having a combination of screens and gray scale produces superior flexographic plates.

DESCRIPTION OF THE PREFERRED EMBODIMENT

Figure 1:
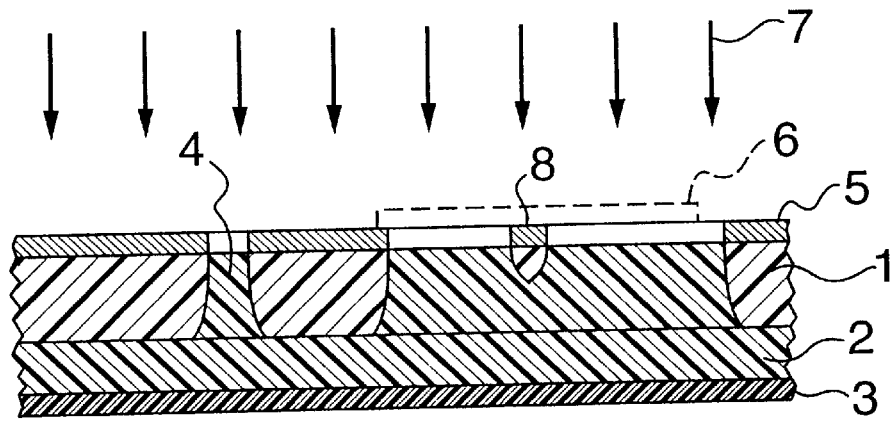
FIG. 1 shows a cross section of the prior art in exposing of photo-polymer flexographic plates.
Figure 2:
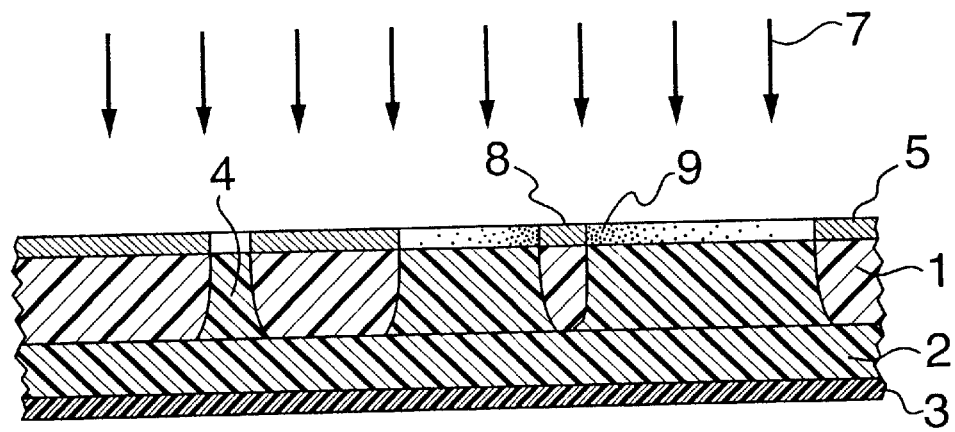
FIG. 2 shows a cross section of the construction of the mask according to the present invention.

Referring to both FIG. 1 and FIG. 2, a flexographic printing plate consists of a photo-polymerizable layer 1, an elastomeric layer 2 (which could be of the same composition as layer 1), and a backing layer 3 for increased dimensional stability. Layer 3 is typically a polymeric material but could be a metal layer as well. The plate is exposed through the film, or mask, 5 using collimated U.V. light 7. In some applications, non-collimated light is used, but for high quality halftone work collimated light is desired. For best performance different areas in the image (e.g. highlights and shadows) require different amounts of exposure. Traditionally this was done by obscuring the areas requiring less light for part of the exposure time, using an opaque object (item 6 in FIG. 1). The location and duration of placing the opaque object 6 required considerable skill. According to the invention, a partial light absorber 9 is incorporated into the film 5. The partial absorber is achieved by exposing selected areas of the film with an intermediate level of light leaving the film neither clear (transparent) not fully absorbing (opaque). The partial absorber does not require any changes to the film, only to the way it is exposed. The location and density of the partial absorber (in optics the terms "optical density", "density" and "absorbance" are used interchangeably) is computed when the film is generated. The general rule is that clear areas around small isolated features require less light; thus a solid area (on the printed page, not the film, which is a negative), will require less light than a highlight (small dot) area. For more exact calculation for the location and density of absorber 9 accurate modeling of the photo-polymerization can be used. A commercial program known as PROLITH 3D can be used for that purpose. Even a very simplified rule, increasing exposure by 100%–300% in highlight areas will yield a large improvement. Since the attenuation is pre-computed and built into the film, no labor or judgment is required to optimize the exposure. Using this invention, the "plugging" of small nonprinting areas 8 are avoided and higher screen rulings can be used.

When film 5 is conventional (silver halide), it is difficult to have high sharpness, as required by halftone work, together with variable light absorbance (gray scale), thus the invention is somewhat difficult to reduce to practice. The implementation is quite straight forwarded when using thermal films. Thermal films are films activated by heat rather than light. Some of the thermal films available, and in particular products made by the Kodak Co. (Rochester, N.Y.) and Imation (formerly 3M, St. Paul, Minn.) are capable of very high sharpness and variable light absorbance. The Kodak product is sold under the name Direct Digital Thermal Film, and the Imation (3M) products is known as Dry Silver Thermal Film. In both of those products the U.V. density of the film can be adjusted by changing the laser energy during exposure. This allows not only uniform U.V. absorbance over selected areas, but variable absorbance, precisely calculated for optimum exposure around each element of the image being reproduced onto the plate. The purely ablative type thermal films, such as Lasermask (from Graphics Technologies, South Hadely, Mass.) do not work well in this application as they are not capable of gray scale.

Film 5 can be held to the plate conventionally (using vacuum) or can form an integral part of the plate by being coated directly onto photo-polymer 1, as disclosed in U.S. Pat. No. 5,262,275. The operation is identical in both cases: collimated U.V. light 7 is blocked by opaque areas 8 of the mask 5 and allowed to exposure photo-polymer 1 in areas where mask is clear. The exposed photo-polymer polymerizes (cross-links) in areas 4 exposed to light. The photo-polymerized area should reach all the way to the elastomeric level 2. By adding variable absorbance mask 9, excessive exposure of small shadow areas is avoided, thus higher resolution screens and finer lines can be produced.

When a continuous gray scale is not possible or desired, an alternative is to use a very fine area modulation, beyond the resolving power of the photo-polymer process, to absorb the light. For example, a pseudo-random dispersion of single pixel dots causes overall light absorbance without reproduction of the individual dots. This method is less desirable as the dots have to be very small, typically under 10 microns, and only very high resolution imaging devices can be used. This method is used when the film is not capable of gray scale, for example thermal films such as Lasermask or Polaroid's Helios (from Polaroid Graphic Imaging, Waltham, Mass). A combination of variable absorbance film and pseudo-random dispersion of dots can be used as well. For example, the film can have three states: fully clear, fully absorbing (opaque) and an intermediate state, absorbing, by the way of example, 75% of the light. The absorbance of the intermediate state can be further modified by a dispersion of clear dots.

The method of creating variable light absorbance by a pseudo random dispersion of small features is well known in the art and is sometimes referred to as "area modulation". The most common example is the creation of gray scales in silver-halide films by the dispersion of opaque silver halide crystals. Another example is the screening process known as "stochastic screening", also referred to as "Frequency Modulated Screening". In all these processes a dispersion of small features, below the resolving capacity of the process, generates a gray scale or a partial absorbance of light.

Figure 3:
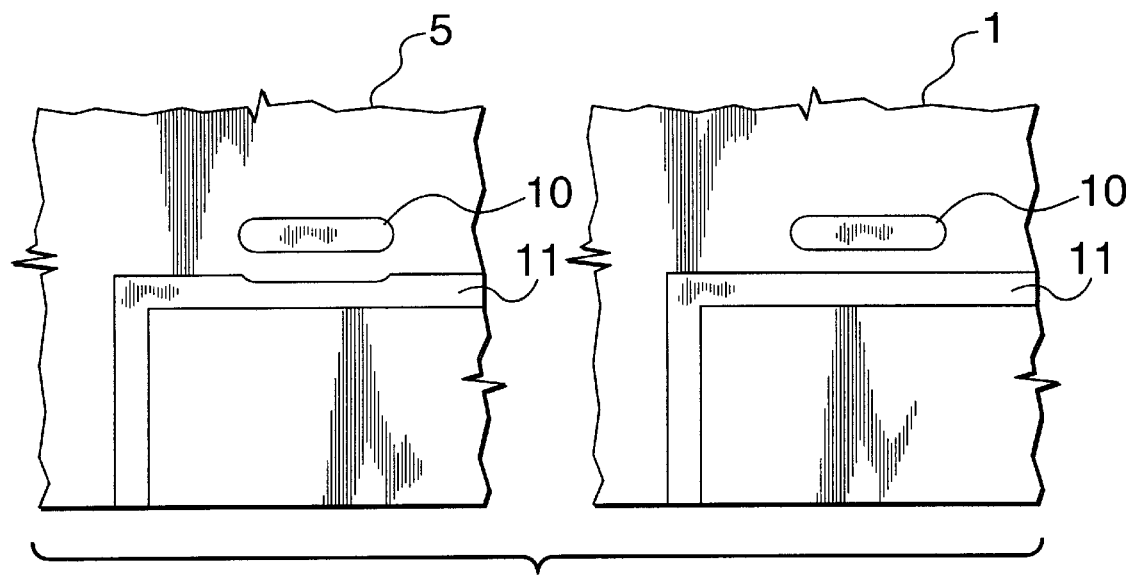
FIG. 3 shows a top view of the proximity correction used by the invention.
Figure 4:
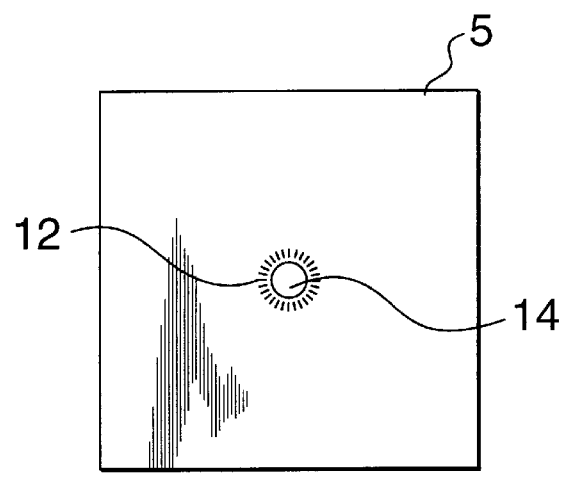
FIG. 4 shows an area of partial absorber generated by area modulation surrounding a small opaque dot.

A second type of exposure correction which can be incorporated in the mask and is particularly effective when combined with the variable absorbance mask is known as proximity correction. Correction of aberration caused in the process of exposing photo-polymers is well known in the field of semiconductors. An article describing proximity correction for semiconductor manufacturing appeared in "Microlithography World", Spring, 1996 and is hereby incorporated in this patent. These effects are modeled by a publicly available software program known as PROLITH. The newest version of this program, PROLITH 3D, is particularly useful for calculating proximity effects in flexographic plates. An example of simple proximity correction is shown in FIG. 3. The features on mask 5 (film) are intentionally distorted to compensate for proximity effects in the exposure process. Where line 11 is close to another line 10 the width of line 11 is reduced to compensate for the increased exposure of the plate polymer due to light leakage from the adjacent feature. Corners in line 11 are pre-distorted into sharper corners, to compensate for corner rounding caused by light scattering and leakage. Features 10, 11 on photo-polymer appear correct while mask 5 appears distorted. Should mask 5 not have the proximity correction, features 10, 11 on the plate will appear distorted. FIG. 4 shows an area of intermediate absorbance formed around on opaque dot 14 on film 5 by very small dots 12, smaller than the printing dot 14. A dispersion of such small dots are equivalent to a film with variable absorbance.

EXAMPLE 1

A liquid photo-polymer type flexographic plate, using F240 resin on a CSL exposure unit, both made by the MacDermid Co. (Wilmington, Del.) was exposed through a Kodak Digital Thermal Film (also known as "Volcano" Film, available from Eastman-Kodak, Rochester, N.Y.). The film was imaged on a Trendsetter 3244 T (from Creo Products, Burnaby, B.C., Canada) in two passes, each pass delivering an energy of about 400 mJ/cm$^2$ and 2400 dpi. Non-imaged areas had an absorbance of over 99.9% of the light (in the U.V.). Areas imaged only by one pass had an absorbance of about 75% of the light (in the U.V.) and areas imaged in both passes had an absorbance of under 10% of the light. The absorbance of the intermediate state was further modified from 75% down to 10% by adding a pseudo-random stochastic screen using single pixel dots. A standard flexographic test pattern, including lines and screens was used, and the absorbance of the intermediate state was modified according to the screen density of the test pattern as follows:

| Screen Density % | 1 | 2 | 5 | 10 | 20 | 30 | 40 | 50 | 60 | 80 | 100 |
|---|---|---|---|---|---|---|---|---|---|---|---|
| Absorbance in U.V. % | 10 | 20 | 50 | 55 | 60 | 65 | 70 | 75 | 75 | 75 | 75 |

The film was placed in the flexographic exposure unit and a 12 minute exposure was used. The exposed plate was developed and printed on a flexographic press, showing superb resolution in which all screens down to 1% were resolved as well as positive and negative (inverse) lines.

The same process was repeated with a regular film, having the same halftone image but no intermediate absorbance state. When this was done it was impossible to find an exposure which would properly print both the highlights and the negative lines at the same time. When a low exposure was used the negative lines were resolved but highlights were missing. When a high exposure was used the highlights were resolved but the negative lines were missing.

I claim:

1. A mask for exposing a halftone image onto a flexographic plate, the plate comprising a photo-polymer, the mask having portions in a clear state, portions in an opaque state and portions in at least one intermediate state having a light absorbance between that of the clear and opaque states in order to expose different parts of the image with different amounts of light, wherein the mask comprises a single-layer thermally exposable film which has an ultraviolet light density which is adjustable by exposure to laser energy.

2. The mask of claim 1 wherein the intermediate light absorbance state is generated by area modulation using feature sizes smaller than a resolving power of a photo-polymerization process of the photo-polymer plate, the photo-polymer plate responding to an average light absorbance of the intermediate states.

3. A mask for exposing a halftone image onto a flexographic plate comprising a photo-polymer, the mask having portions in a clear state, portions in an opaque state and portions in at least one intermediate state having a light absorbance between that of the clear and opaque states in order to expose different parts of the image with different amounts of light, wherein the mask comprises a thermal film having a density to ultraviolet light which is adjustable by exposure to laser energy and the mask forms an integral layer of the flexographic plate.

4. The mask of claim 3 wherein the intermediate light absorbance states are generated by area modulation using feature sizes smaller than a resolving power of a photo-polymerization process of the photo-polymer plate, the photo-polymer plate responding to an average light absorbance of the intermediate states.

5. A flexographic printing plate comprising a photo-polymer layer and a mask layer overlying the photo-polymer layer, the mask layer having portions in a clear state, portions in an opaque state and portions in at least one intermediate state having a light absorbance between that of the clear and opaque states in order to expose different parts of the photo-polymer layer with different amounts of light, wherein the mask comprises a thermal film having an ultraviolet light density which is adjustable by exposure to laser energy.

* * * * *